(12) United States Patent
Hau et al.

(10) Patent No.: US 6,475,875 B1
(45) Date of Patent: Nov. 5, 2002

(54) SHALLOW TRENCH ISOLATION ELEVATION UNIFORMITY VIA INSERTION OF A POLYSILICON ETCH LAYER

(75) Inventors: Pang Chong Hau, Singapore (SG); Chen Feng, Singapore (SG); Alex See, Singapore (SG); Peter Hing, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/900,410

(22) Filed: Jul. 9, 2001

(51) Int. Cl.[7] ................ H01L 21/76; H01L 21/311
(52) U.S. Cl. ................ 438/424; 438/427; 438/693; 438/697; 438/710; 438/436; 438/396
(58) Field of Search ................ 438/424, 629, 438/149, 3, 653, 268, 396, 106, 692, 241, 436, 734, 427, 270, 257, 296, 279, 775, 435, 400, 691, 693, 697, 710

(56) References Cited

U.S. PATENT DOCUMENTS

| 4,836,885 A | 6/1989 | Breiten et al. ........... 156/643 |
| 5,173,439 A | 12/1992 | Dash et al. ............... 437/67 |
| 5,346,584 A | 9/1994 | Nasr et al. ............... 156/636 |
| 5,382,541 A | 1/1995 | Bajor et al. .............. 437/67 |
| 5,494,857 A | 2/1996 | Cooperman et al. ........ 437/228 |
| 5,721,173 A | 2/1998 | Yano et al. .............. 438/424 |
| 6,015,757 A | 1/2000 | Tsai et al. .............. 438/697 |
| 6,090,714 A | * 7/2000 | Jang et al. .............. 438/692 |
| 6,103,592 A | 8/2000 | Levy et al. .............. 438/424 |
| 6,399,461 B1 | * 6/2002 | Liu et al. ............... 438/436 |

* cited by examiner

Primary Examiner—Matthew Smith
Assistant Examiner—Igwe U. Anya
(74) Attorney, Agent, or Firm—George O. Saile; Rosemary L. S. Pike

(57) ABSTRACT

A process for forming insulator filled, shallow trench isolation (STI), regions in a semiconductor substrate, featuring a disposable polysilicon stop layer used to allow uniform insulator fill to be obtained, independent of shallow trench width, has been developed. The process features filling shallow trench shapes with a first high density plasma (HDP), deposited silicon oxide layer, followed by the deposition of the thin polysilicon stop layer, and a second HDP silicon oxide layer. After a planarizing chemical mechanical polishing procedure residual regions of the second HDP silicon oxide, still remaining in regions overlying the insulator filled shallow trench shapes, are selectively removed using the thin polysilicon layer as a stop layer. The polysilicon layer is then thermally oxidized. The thickness of the polysilicon layer can be varied such that the resultant polysilicon oxide layer serves to alleviate the possible oxide loss in the STI regions during subsequent clean processes.

28 Claims, 4 Drawing Sheets

SHALLOW TRENCH ISOLATION ELEVATION UNIFORMITY VIA INSERTION OF A POLYSILICON ETCH LAYER

BACKGROUND OF THE INVENTION (1) Field of the Invention

The present invention relates to methods used to fabricate semiconductor devices, and more specifically to a method used to form shallow trench isolation (STI), regions in a semiconductor substrate.

(2) Description of Prior Art

Insulator filled, shallow trenches, are being used in the semiconductor industry to isolate specific elements of an integrated circuit, such as transistors, diodes, capacitors, and resistors. With the advent of micro-miniaturization, or the ability to fabricate semiconductor devices comprised with sub-micron features, the insulator filled, shallow trench shapes have to be formed with various widths to adequately isolate various size elements, however all shallow trench shapes have to be formed to the same depth in the semiconductor substrate, and independent of width have to be uniformly filled with an insulator layer. Due to the topography created by the various elements of the integrated circuit, and due to the varying spaces between the shallow trenches, uniform fill of all shallow trenches, independent of width, is critical, therefore insulator overfilling of all shallow trench shapes is used to guarantee complete filing of all size shallow trench shapes. The insulator overfilling procedures however result in difficulties in planarizing, or removing unwanted insulator from regions outside the shallow trenches, in regards to larger amounts of insulator formed between densely packed elements, compared to lesser amounts of insulator layer located in regions in which large spaces between shallow trenches exist. Therefore several planarization procedures, or processes used to remove unwanted insulator layer from regions outside the shallow trenches, have been developed to optimize planarization, or to obtain uniformly filled, shallow trench isolation (STI), regardless of shallow trench width, or the spacing between shallow trenches.

One such planarization procedure features the use of reverse masking, or protecting specific regions of insulator layer with a photoresist shape defined using the reverse photomask previously used to define active device regions located between shallow trench shapes. The reverse masking procedure protects against a dishing phenomena that can occur during a chemical mechanical polishing procedure, used to remove, or to planarize regions of insulator layer residing on large spaces between shallow trench shapes, or even used to protect against dishing of insulator layer residing in a wide shallow trench shape. The use of the reverse masking procedure however is costly, and complex, due to the increased photolithographic procedure.

This invention will describe a planarization procedure in which unwanted insulator layer is removed from narrow as well as from wide spaces that exist between shallow trench shapes, resulting in uniformly filled, shallow trench shapes, with the insulator fill at the same level for all shallow trench shapes, independent of the shallow trench width. The planarization procedure described in this invention is accomplished without additional, costly photolithographic procedures, realized featuring the use of a polysilicon layer used as a stop layer, with removal of the polysilicon stop layer accomplished via thermal oxidation and selective wet etch procedures. Prior art, such as Copperman et al, in U.S. Pat. No. 5,494,857, describe the use a polysilicon layer as a stop layer for STI planarization, however that prior art still involves the use of costly photolithographic procedures for planarization, in addition to removal of the polysilicon stop layer via chemical mechanical polishing procedures.

SUMMARY OF THE INVENTION

It is an object of this invention to form shallow trench isolation (STI), regions, in a semiconductor substrate, with the shallow trench regions, uniformly filled with insulator independent of shallow trench width, and independent of the space between the shallow trench shapes.

It is another object of this invention to use polysilicon as a stop layer, or to protect insulator layer in the shallow trench shapes from a dry etch procedure used to remove unwanted residual insulator layer, still remaining after a chemical mechanical polishing (CMP), planarization procedure.

It is still another object of this invention to use the polysilicon stop layer to alleviate oxide loss at STI regions during subsequent wet etch steps, via conversion to a silicon oxide layer via thermal oxidation.

In accordance with the present invention a process for forming insulator filled, shallow trench isolation (STI), regions, featuring the use of a disposable polysilicon layer used to protect the STI regions during a chemical mechanical polishing—dry etch planarization procedure, is described. After formation of various width, shallow trench shapes, in a silicon nitride layer and in a top portion of a semiconductor substrate, a first, high density plasma (HDP), procedure results in filling of all shallow trench shapes with a first insulator layer, to a level equal to the top surface of the semiconductor substrate, while thicker regions of the first insulator layer reside on the top surface of the silicon nitride shapes, located between shallow trench shapes. A thin polysilicon layer is conformally deposited, overlying the regions of first insulator layer in the shallow trench shapes, as well as overlying regions of first insulator layer residing on the silicon nitride shapes. A second HDP insulator layer then fills the spaces between silicon nitride shapes, to a level planar with the top surface of the silicon nitride shapes. A CMP procedure is next performed for planarization purposes, removing regions of second HDP insulator layer, and regions of the thin polysilicon layer, located on the top surface of the silicon nitride shapes, resulting in regions of residual second HDP insulator layer, overlying thin polysilicon layer, still located between silicon nitride shapes, and residing on the insulator filled, STI regions. The residual second HDP insulator layer is then selectively removed via dry etching procedures using the polysilicon layer as an etch stop, protecting first HDP insulator layer in the shallow trench shapes. A thermal oxidation procedure is used to convert the thin polysilicon layer to silicon oxide, followed by wet etch procedures used to remove the silicon nitride shapes, and to selectively remove the oxidized thin polysilicon layer, resulting in STI regions, comprised with shallow trench shapes of various widths, all filled with first HDP insulator layer, to a level planar with the top surface of the semiconductor substrate.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
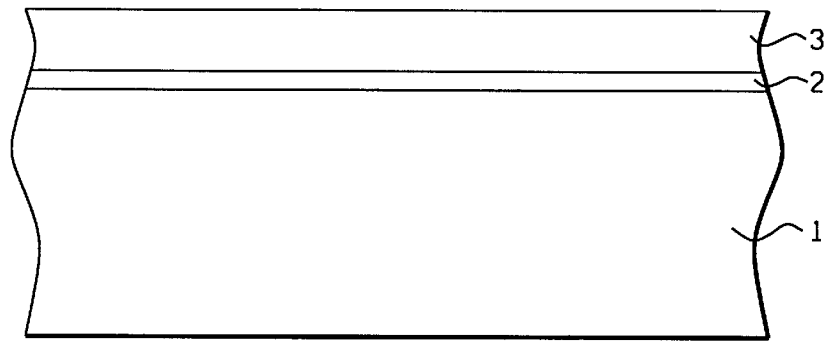
FIGS. 1–9, which schematically, in cross-sectional style, describe key stages of formation of insulator filled, STI regions, featuring a polysilicon stop layer used during a selective dry etch cycle as a component of the STI planarization procedure.

The process for forming insulator filled, shallow trench isolation regions featuring the use of a disposable polysilicon stop layer, enabling uniform insulator fill to be realized, independent of the spacing between the shallow trenches and independent of shallow trench width, will now be described in detail. A semiconductor substrate 1, comprised of P type, single crystalline silicon, with a <100>crystallographic orientation, is used and schematically shown in FIG. 1. Silicon dioxide layer 2, is next thermally grown to a thickness between about 200 to 500 Angstroms, followed by the deposition of silicon nitride layer 3, at a thickness between about 1000 to 3000 Angstroms, obtained via low pressure chemical vapour deposition (LPCVD), or via plasma enhanced chemical vapour deposition (PECVD), procedures. The result of these procedures is schematically shown in FIG. 1.

Figure 2:
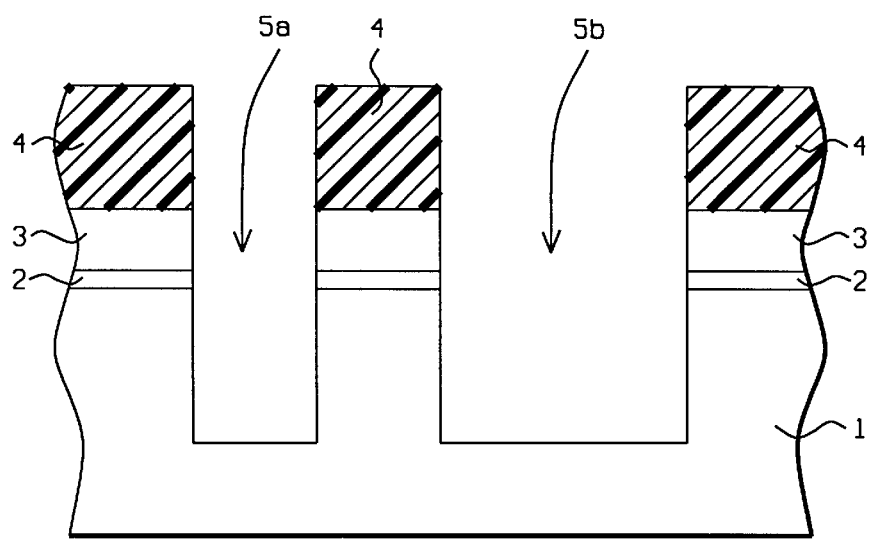

Photoresist shape 4, is next formed and used as an etch a mask to allow an anisotropic, reactive ion etching (RIE), procedure to from shallow trench shapes in semiconductor substrate 1. This is schematically in FIG. 2. The anisotropic RIE procedure is performed using $CF_4$ or $CHF_3$ as an etchant for silicon nitride layer 3, and for silicon dioxide layer 2, while $SF_6$ or $Cl_2$ is used as an etchant for semiconductor substrate 1. The depth of the shallow trenches in semiconductor substrate 1, is between about 2000 to 4000 Angstroms, with a width for narrow shallow trench shape 5a, of 2000 to 5000 Angstroms, while wide shallow trench shape 5b, exhibits a width of between about 0.50 to 100 $\mu$m. The space between narrow shallow trench shape 5a, and wide shallow trench shape 5b, is between about 0.20 to 100 $\mu$m.

Figure 3:
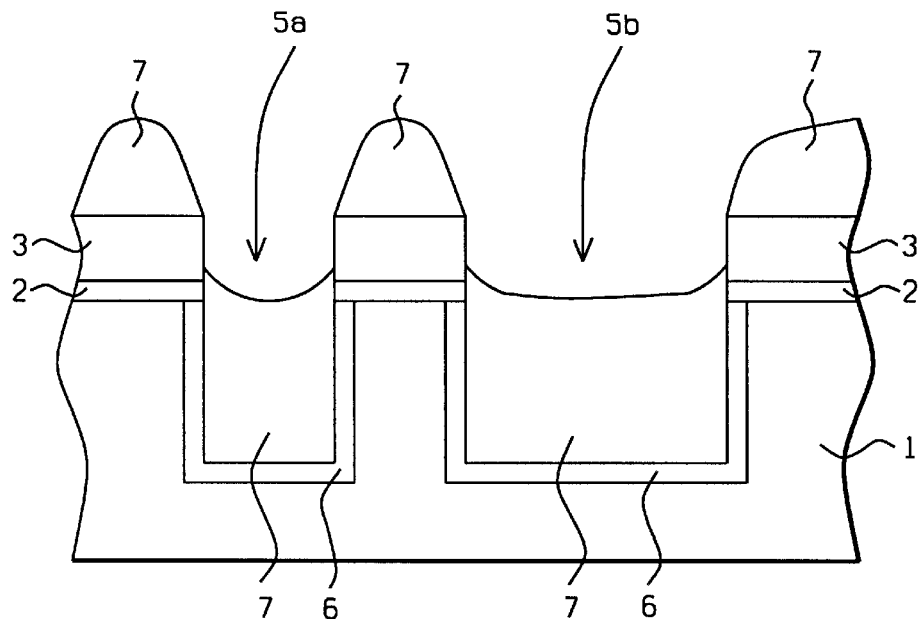

After removal of photoresist shape 4, via plasma oxygen ashing and careful wet cleans, silicon dioxide layer 6, is thermally grown at a thickness between about 200 to 400 Angstroms, providing the high density, trench liner layer, needed to accommodate subsequent lower density, insulator trench fill. Silicon oxide layer 7, is next deposited, via high density plasma (HDP), procedures, at a thickness between about 2000 to 4000 Angstroms, filling both narrow trench shape 5a, as well as wide trench shape 5b, to a level planar with the top surface of silicon dioxide layer 2. This is schematically shown in FIG. 3. The silicon oxide HDP procedure also results in deposition of silicon oxide layer 7, on the top surface of silicon nitride layer 3, at a thickness between about 2000 to 4000 Angstroms, however the bottom—up deposition characteristic of the HDP procedure, does not result in bridging, or does not result in silicon oxide being deposited on the sides of silicon nitride layer 3, exposed in the shallow trench shapes. This is schematically shown in FIG. 3.

Figure 4:
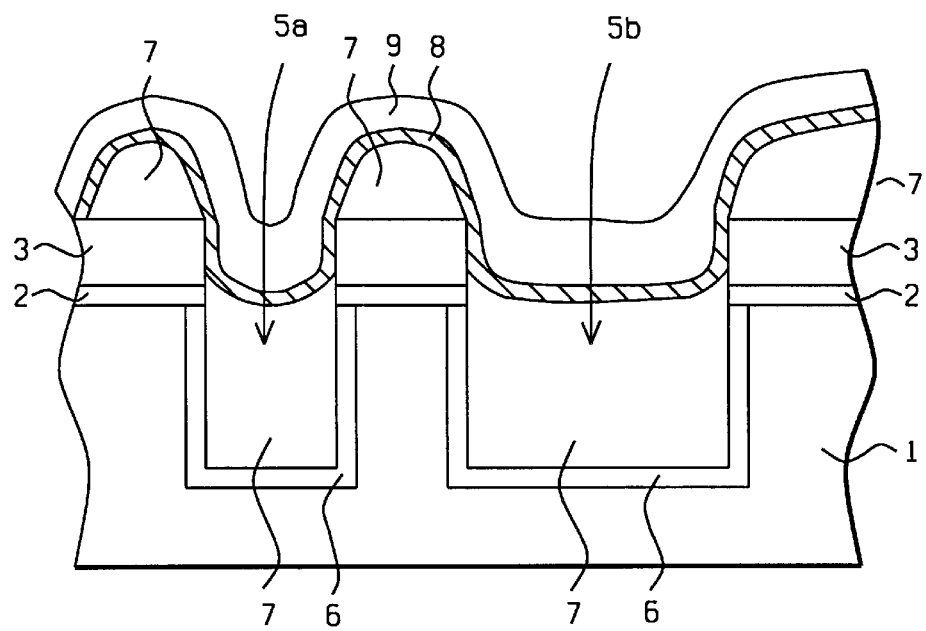

The ability to remove regions of silicon oxide layer, from the top surface of silicon nitride layer 3, to form the desired insulator filled, STI regions, is next addressed. However if a chemical mechanical polishing (CMP), procedure were to next be used to remove unwanted regions of silicon oxide layer 7, an unwanted dishing phenomena would occur in wide trench regions, removing, or dishing, silicon oxide layer 7, from wide shallow trench shape 5b, resulting in an inadequate insulator fill. Therefore a procedure utilizing a stop layer, and an additional, overlying HDP insulator layer, is employed to reduce the risk of dishing and to adequately form uniform insulator fills, in all width trenches, without the use of additional, costly photolithographic procedures. In addition this procedure provides thickness control of the post—STI oxide, during subsequent oxide removal procedures, such buffered hydrofluoric acid dips used to remove sacrificial or screen oxides. This novel procedure initiates with the deposition of polysilicon layer 8, obtained via a conformal LPCVD procedure, at a thickness between about 100 to 300 Angstroms. Another HDP procedure is then used to deposit silicon oxide layer 9, at a thickness between about 2000 to 4000 Angstroms. The result of these depositions is schematically shown in FIG. 4. The deposition of silicon oxide layer 9, is performed to a level in which the top surface of silicon oxide layer 9, located between shallow trench shapes, is planar with the top surface of silicon nitride layer 3.

Figure 5:
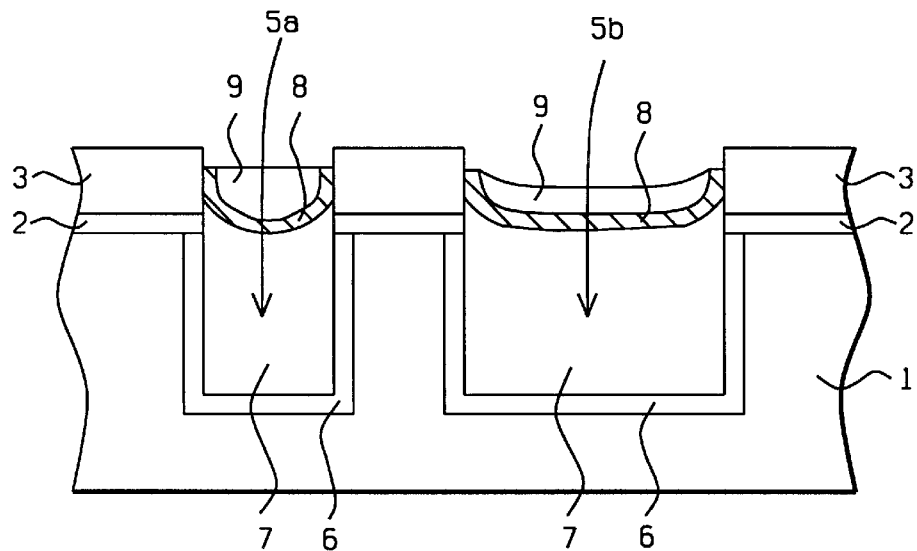

A first, or initial stage of a CMP procedure is next used to remove the regions of silicon oxide layer 9, as well the regions of polysilicon layer 8, from the top surface of silicon nitride layer 3. The selective, first CMI procedure, in regards to the non-removal of silicon nitride, is terminated at the appearance of the top surface of silicon nitride layer 3, with a second, or final stage of the CMN procedure, employed to insure complete removal of these materials from the top surface of silicon nitride. The result of the Cow procedure is schematically shown in FIG. 5, featuring the insulator filled STI regions, overlaid with portions of silicon oxide layer 9, and polysilicon layer 8, which in turn are located on the insulator filled STI regions. It can be seen in FIG. 5, that during the CMI procedure dishing, or removal of the portion of silicon oxide layer 9, occurred in the region in which silicon oxide layer 9, overlaid wide shallow trench shape 5b. This dishing phenomena, occurring to a disposable silicon oxide layer, is not critical, however without the use of polysilicon layer 8, and silicon oxide layer 9, unwanted dishing of silicon oxide layer 7, in wide shallow trench shape 5b, would have occurred.

Figure 6:
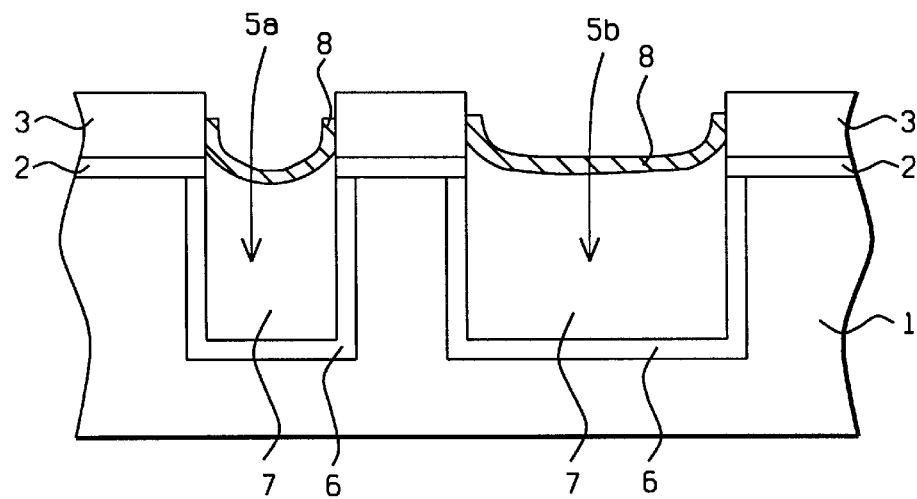

Remaining portions of silicon oxide layer 9, located in regions overlying both narrow shallow trench shape 5a, and wide shallow trench shape 5b, are next removed via a selective RIE procedure, using $CHF_3$ as an etchant. This is schematically shown in FIG. 6. The presence of polysilicon layer 8, used as a stop layer, allowed the selective RIE procedure to completely remove the portion of silicon oxide layer 9, overlying wide shallow trench shape 5b, in addition to removing of the thicker portion of silicon oxide layer 9, located overlying narrow shallow trench shape 5a, without vulnerability to the critical, silicon oxide layer 7, in the shallow trench shapes.

Figure 7:
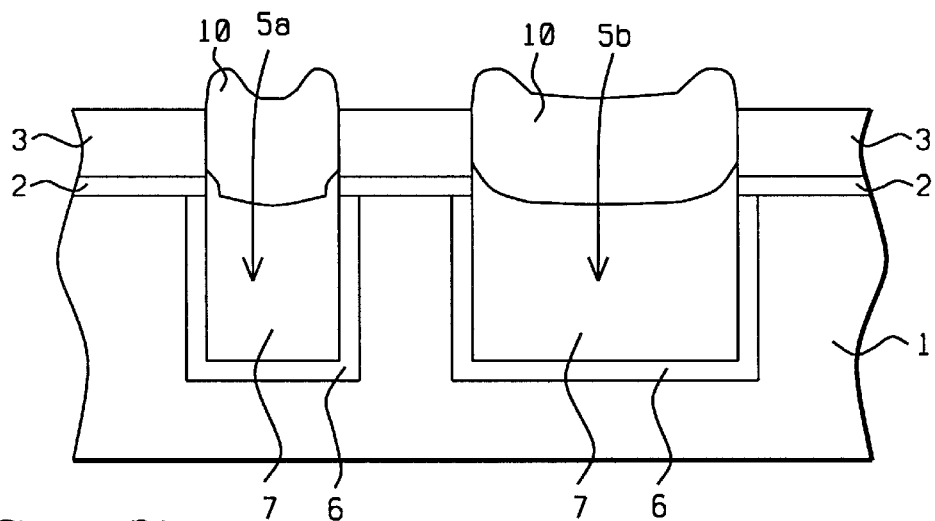
Figure 8:
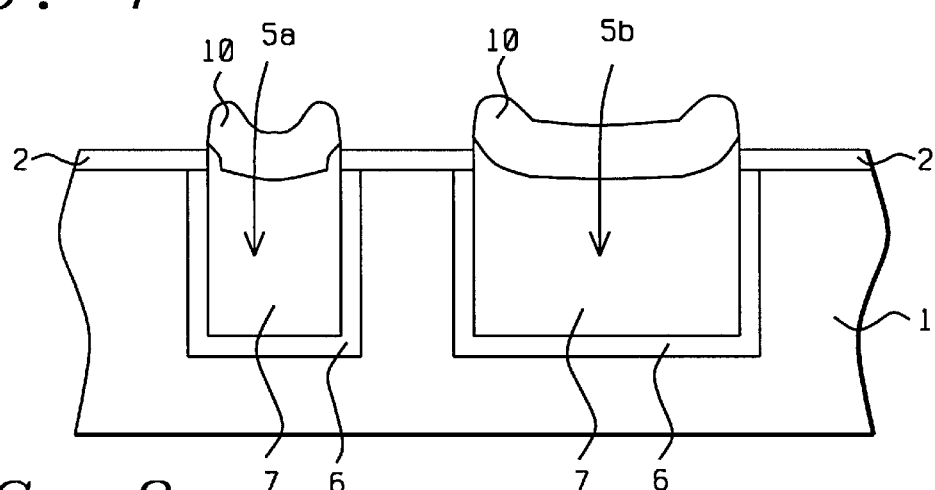
Figure 9:
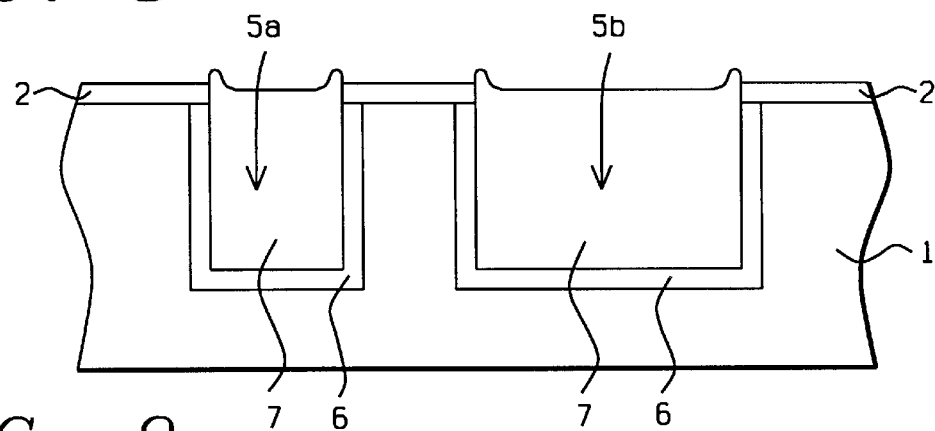

Oxidation of the polysilicon stop layer 8, as well as removal of silicon nitride layer 3, and underlying pad silicon oxide layer 2, is next addressed and schematically described using FIGS. 7–9. This is initiated with the conversion of polysilicon layer 8, to polysilicon oxide shapes 10, via thermal oxidation procedures. The thickness of polysilicon oxide shapes 10, is between about 2 to 4 times greater than the thickness of polysilicon layer 8. This is schematically shown in FIG. 7. The presence of silicon nitride layer 3, protects all regions of semiconductor substrate 1, from the oxidation ambient. Silicon nitride layer 3, is next selectively removed via use of a hot phosphoric solution, resulting in polysilicon oxide shapes 10, protruding upwards from the top of the shallow trench shapes. This is schematically displayed in FIG. 8. Finally pad silicon oxide layer 2, is removed via subjection to a buffered hydrofluoric (BHF), or to a dilute hydrofluoric (DHF), dip. The result of this procedure is schematically shown in FIG. 9, with final insulator filled, STI regions, featuring silicon oxide fills that are in turn planar with the top surface of silicon dioxide layer 2, independent of the width of the STI region. The thickness of polysilicon oxide shapes 10, was designed to allow protection of the STI regions during specific BHF procedures, such as isotropic wet etch removal of pad silicon oxide layer 2, and also designed to be consumed by these wet etch procedures at the conclusion of the process.

While this invention has been particularly shown and described with reference to, the preferred embodiments thereof, it will be understood by those skilled in the art that various changes in form and details may be made without departing from the spirit and scope of this invention.

What is claimed is:

1. A method of forming insulator filled, shallow trench isolation (STI), regions in a semiconductor substrate, comprising the steps of:

growing a first silicon dioxide layer on said semiconductor substrate;

depositing a silicon nitride layer;

forming shallow trench shapes in said silicon nitride layer, in said first silicon dioxide layer, and in a top portion of said semiconductor substrate;

growing a second silicon dioxide layer on surfaces of said semiconductor substrate exposed in said shallow trench shapes;

depositing a first silicon oxide layer, with a first portion of said first silicon oxide layer located on the top surface of said silicon nitride layer, and with a second portion of said first silicon oxide layer filling said shallow trench shapes;

depositing a thin stop layer;

depositing a second silicon oxide layer on said thin stop layer, removing first portions of said second silicon oxide layer, first portions of said thin stop layer, and said first portions of said first silicon oxide layer, from top surface of said silicon nitride layer, leaving second portions of said second silicon oxide layer, and second portions of said thin stop layer, on said second portions of said first silicon oxide layer, located in said shallow trench shapes;

selectively removing said second portions of said second silicon oxide layer from the top surface of said second portions of said thin stop layer;

performing a thermal oxidation procedure to convert said second portions of said thin stop layer to an oxidized stop layer;

selectively removing said silicon nitride layer; and removing said first silicon dioxide layer resulting in said insulator filled, STI regions located in said top portion of said semiconductor substrate.

2. The method of claim 1, wherein said first silicon dioxide layer is thermally grown to a thickness between about 200 to 500 Angstroms.

3. The method of claim 1, wherein said silicon nitride layer is obtained via low pressure chemical vapour deposition (LPCVD), or via plasma enhanced chemical vapour deposition (PECVD), procedures, at a thickness between about 1000 to 3000 Angstroms.

4. The method of claim 1, wherein said shallow trench shapes are formed via an anisotropic reactive ion etching procedure using $CF_4$ or $CHF_3$ as an etchant for silicon nitride and for silicon dioxide, while $SF_6$ or $Cl_2$ is used as an etchant for silicon.

5. The method of claim 1, wherein the depth of said shallow trench shapes, in said semiconductor substrate, is between about 2000 to 4000 Angstroms.

6. The method of claim 1, wherein said shallow trench shapes are comprised with narrow shallow trench shapes, with a width between about 2000 to 5000 Angstroms, and comprised with wide shallow trench shapes, with a width between about 0.20 to 100 $\mu$m.

7. The method of claim 1, wherein said second silicon dioxide layer is thermally grown to a thickness between about 200 to 400 Angstroms.

8. The method of claim 1, wherein said first silicon oxide layer, used to fill said shallow trench shapes, is obtained via high density plasma (HDP), procedures, at a thickness between about 2000 to 4000 Angstroms.

9. The method of claim 1, wherein said thin stop layer is a polysilicon layer, obtained via LPCVD procedures, at a thickness between about 100 to 300 Angstroms.

10. The method of claim 1, wherein said second silicon oxide layer is obtained via HDP procedures, at a thickness between about 2000 to 4000 Angstroms.

11. The method of claim 1, wherein said first portions of said second silicon oxide layer, said first portions of said thin stop layer, and said first portions of said first silicon oxide layer, are removed from the top surface of said silicon nitride layer via a chemical mechanical polishing procedure.

12. The method of claim 1, wherein said second portions of said second silicon oxide layer are selectively removed from the top surface of said second portions of said thin stop layer via a selective reactive ion etching procedure, using $CHF_3$ as an etchant.

13. The method of claim 1, wherein said silicon nitride layer is selectively removed via use of a hot phosphoric acid solution.

14. The method of claim 1, wherein said first silicon dioxide layer is removed via use of a buffered hydrofluoric acid solution, or via use of a dilute hydrofluoric acid solution.

15. A method of forming insulator filled, shallow trench isolation (STI), regions in a semiconductor substrate, featuring a disposable polysilicon stop layer, used to allow uniform insulator filling in shallow trenches to be realized, independent of the spacing between said shallow trenches and independent of shallow trench width, comprising the steps of:

growing a silicon dioxide pad layer on said semiconductor substrate;

depositing a silicon nitride layer;

forming shallow trench shapes, comprised with various widths, in said silicon nitride layer, in said pad silicon dioxide layer, and in a top portion of said semiconductor substrate;

growing a silicon dioxide liner layer on surfaces of said semiconductor substrate exposed in said shallow trench shapes;

depositing a first high density plasma (HDP), silicon oxide layer, with a first portion of said first HDP silicon oxide layer located on the top surface of said silicon nitride layer, and with a second portion of said first HDP silicon oxide layer filling said shallow trench shapes;

depositing said polysilicon stop layer;

depositing a second HDP silicon oxide layer on said polysilicon stop layer;

removing first portions of said second HDP silicon oxide layer, first portions of said polysilicon stop layer, and first portions of said first HDP silicon oxide layer, from top surface of said silicon nitride layer, leaving second portions of said second HDP silicon oxide layer, and second portions of said polysilicon stop layer, on said second portions of said first HDP silicon oxide layer, located in said shallow trench shapes;

selectively removing said second portions of said second HDP silicon oxide layer from the top surface of said second portions of said polysilicon stop layer;

performing a thermal oxidation procedure to convert said second portions of said polysilicon stop layer to a polysilicon oxide layer;

selectively removing said silicon nitride layer; and removing said silicon dioxide pad layer resulting in said insulator filled, STI regions, located in said top portion of said semiconductor substrate.

16. The method of claim 15, wherein said first silicon dioxide pad layer is thermally grown to a thickness between about 200 to 500 Angstroms.

17. The method of claim 15, wherein said silicon nitride layer is obtained via low pressure chemical vapour deposition (LPCVD), or via plasma enhanced chemical vapour deposition (PECVD), procedures, at a thickness between about 1000 to 3000 Angstroms.

18. The method of claim 15, wherein said shallow trench shapes are formed via an anisotropic reactive ion etching procedure using $CF_4$ or $CHF_3$ as an etchant for silicon nitride and for silicon dioxide, while $SF_6$ or $Cl_2$ is used as an etchant for silicon.

19. The method of claim 15, wherein the depth of said shallow trench shapes, in said semiconductor substrate, is between about 2000 to 4000 Angstroms.

20. The method of claim 15, wherein said shallow trench shapes are comprised with narrow shallow trench shapes, with a width between about 2000 to 5000 Angstroms, and comprised with wide shallow trench shapes, with a width between about 0.50 to 100 $\mu$m.

21. The method of claim 15, wherein said silicon dioxide liner layer is thermally grown to a thickness between about 200 to 400 Angstroms.

22. The method of claim 15, wherein said first high density plasma (HDP), silicon oxide layer, used to fill said shallow trench shapes, is deposited at a thickness between about 2000 to 4000 Angstroms.

23. The method of claim 15, wherein said polysilicon stop layer is obtained via LPCVD procedures, at a thickness between about 100 to 300 Angstroms.

24. The method of claim 15, wherein said second HDP silicon oxide layer is deposited at a thickness between about 2000 to 4000 Angstroms.

25. The method of claim 15, wherein said first portions of said second HDP silicon oxide layer, said first portions of said polysilicon stop layer, and said first portions of said first HDP silicon oxide layer, are removed from the top surface of said silicon nitride layer via a chemical mechanical polishing procedure.

26. The method of claim 15, wherein said second portions of said HDP second silicon oxide layer are selectively removed from the top surface of said second portions of said polysilicon stop layer via a selective reactive ion etching procedure, using $CHF_3$ as an etchant.

27. The method of claim 15, wherein said silicon nitride layer is selectively removed via use of a hot phosphoric acid solution.

28. The method of claim 15, wherein said silicon dioxide pad layer, originally underlying said silicon nitride layer, is removed via use of a buffered hydrofluoric acid solution, or via use of a dilute hydrofluoric acid solution.

* * * * *